United States Patent
Gui et al.

(10) Patent No.: US 7,522,266 B2
(45) Date of Patent: **\*Apr. 21, 2009**

(54) LITHOGRAPHIC APPARATUS AND DEVICE MANUFACTURING METHOD

(75) Inventors: Cheng-Qun Gui, Best (NL); Arno Jan Bleeker, Westerhoven (NL); Pieter Willem Herman De Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 263 days.

This patent is subject to a terminal disclaimer.

(21) Appl. No.: 11/593,041

(22) Filed: Nov. 6, 2006

(65) Prior Publication Data

US 2007/0046919 A1    Mar. 1, 2007

Related U.S. Application Data

(63) Continuation of application No. 10/779,811, filed on Feb. 18, 2004, now Pat. No. 7,133,118.

(51) Int. Cl.
*G03B 27/54* (2006.01)
*G03B 27/42* (2006.01)
*G03B 27/52* (2006.01)
*G03B 27/32* (2006.01)
*G02B 26/08* (2006.01)

(52) U.S. Cl. .............. 355/70; 355/53; 355/55; 355/67; 355/77; 359/224

(58) Field of Classification Search .............. 355/53, 355/55, 67, 69, 70, 71, 77; 359/224, 291, 359/619

See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,499,131 | A | 3/1996 | Kim |
| 5,500,736 | A | 3/1996 | Koitabashi et al. |
| 5,504,504 | A | 4/1996 | Markandey et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |

(Continued)

FOREIGN PATENT DOCUMENTS

EP    1 482 375 A2    12/2004

(Continued)

OTHER PUBLICATIONS

European Search Report issued Jun. 27, 2005 for Application No. EP 05 25 0813, 5 pgs.

(Continued)

*Primary Examiner*—Alan A Mathews
(74) *Attorney, Agent, or Firm*—Sterne, Kessler, Goldstein & Fox P.L.L.C.

(57) ABSTRACT

Provided is a method and system for facilitating use of a plurality of individually controllable elements to modulate the intensity of radiation received at each focusing element of an array of focusing elements to control the intensity of the radiation in the areas on the substrate onto which the focusing elements direct the radiation.

6 Claims, 3 Drawing Sheets

U.S. PATENT DOCUMENTS

| | | |
|---|---|---|
| 5,808,797 A | 9/1998 | Bloom et al. |
| 5,982,553 A | 11/1999 | Bloom et al. |
| 6,002,466 A | 12/1999 | Brauch et al. |
| 6,133,986 A | 10/2000 | Johnson |
| 6,177,980 B1 | 1/2001 | Johnson |
| 6,285,488 B1 | 9/2001 | Sandstrom |
| 6,301,000 B1 | 10/2001 | Johnson |
| 6,379,867 B1 | 4/2002 | Mei et al. |
| 6,473,237 B2 | 10/2002 | Mei |
| 6,509,955 B2 | 1/2003 | Mei et al. |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,833,854 B1 | 12/2004 | Sandstrom |
| 7,133,118 B2 * | 11/2006 | Gui et al. ............ 355/70 |
| 2002/0097495 A1 | 7/2002 | Mei |
| 2002/0171816 A1 | 11/2002 | Markle |
| 2003/0179352 A1 | 9/2003 | Van Der Mast |
| 2003/0206281 A1 | 11/2003 | Jain |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/33096 A1 | 7/1998 |
| WO | WO 98/38597 A2 | 9/1998 |

OTHER PUBLICATIONS

Translation of Korean Office Action issued Jul. 31, 2006 for Application No. 10-2005-0013304, 3 pgs.

* cited by examiner

LITHOGRAPHIC APPARATUS AND DEVICE MANUFACTURING METHOD

CROSS REFERENCE TO RELATED APPLICATION

The present application is a continuation of U.S. application Ser. No. 10/779,811, filed Feb. 18, 2004, now issued as U.S. Pat. No. 7,133,118, and incorporated by reference herein in its entirety.

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. A lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device). This pattern can be imaged onto a target portion (e.g., comprising part of, one or several dies) on a substrate (e.g., a silicon wafer or glass plate) that has a layer of radiation sensitive material (resist). Instead of a mask, the patterning means may comprise an array of individually controllable elements which serve to generate the circuit pattern.

In general, a single substrate will contain a network of adjacent target portions that are successively exposed. Known lithographic apparatus include so-called steppers, in which each target portion is irradiated by exposing an entire pattern onto the target portion in one go, and so called scanners, in which each target portion is irradiated by scanning the pattern through the projection beam in a given direction (the "scanning"-direction) while synchronously scanning the substrate parallel or anti-parallel to this direction.

In the manufacture of flat panel displays, for example, it is often desirable to be able to expose the substrate such that different regions of substrate receive different overall doses of radiation. By so doing it is possible to completely remove a resist on the substrate in some regions, leave the full thickness of resist in other regions and also provide additional regions in which the resist has been partially removed, for example.

This capability is often referred to as half tone or gray tone exposure. This enables a plurality of processing steps in the subsequent manufacturing process to be performed for a single exposure step. For example, a process may be applied to the parts of the substrate that are fully exposed after the exposure. Next a given thickness of resist is removed from those regions which are still covered by resist. This exposes additional regions of the substrate but does not expose those regions where the resist was thickest; subsequently an additional processing step can be performed on only those regions that are now exposed. Finally, all of the remaining resist may be removed before a processing step is performed on the entire substrate.

Gray tone exposure may be produced by individual portions of the substrate being exposed at a given intensity for different amounts of time, by exposing individual portions for the same amount of time but at different intensities (the capability for which is commonly referred to as gray scale exposure) or by a combination of the two.

The present invention provides a method and apparatus for applying different radiation doses to different regions of a substrate.

SUMMARY OF THE INVENTION

Consistent with the principles of the present invention as embodied and broadly described herein, a lithographic apparatus includes an illumination system for supplying a projection beam of radiation. Also included is an array of individually controllable elements serving to impart the projection beam with a pattern in its cross-section and a substrate table for supporting a substrate initially, a projection system is included for projecting the patterned beam onto a target portion of the substrate, wherein the projection system includes an array of focusing elements, arranged such that each focusing element directs the radiation in the patterned beam from a plurality of the individually controllable elements onto an area on the substrate.

Accordingly, if all of the individually controllable elements associated with a given focusing element are set to provide high intensity radiation to the focusing element, the intensity of the radiation in the associated area on the substrate will be high and the dose of radiation received over a given exposure time will be relatively high. If all of the individually controllable elements associated with the focusing element are set such that a low intensity of radiation (or, preferably, no radiation) is directed to the focusing element, then the intensity of the radiation (and hence the radiation dose for a given exposure time) in the area on the substrate will be low.

By setting some of the individually controllable elements associated with the focusing element to direct high intensity radiation to the focusing element and some to direct low intensity radiation to the focusing element, the intensity of the radiation in the associated area on the substrate will be at an intermediate value, thereby providing an intermediate dose of radiation for the same exposure time as in the previous two settings. Accordingly, by providing gray scale control, the required gray tone control can be provided. It will be appreciated that the more individually controllable elements there are associated with each focusing element, the greater the number of possible intermediate levels of radiation intensity, or gray scale levels, that can be provided in each area on the substrate associated with each focusing element.

Preferably, each of the individually controllable elements can be set to three or more states. For example, a first state is provided in which the maximum proportion of the intensity directed onto the individually controllable element is directed onto the associated focusing element. A second state is provided in which a minimum, preferably substantially zero, proportion of the radiation incident on the individually controllable element is directed to the corresponding focusing element. Additional states are provided in which the proportion of the radiation incident on the individually controllable element that is directed to the corresponding focusing element is between that of the first and second states and different to any other states. By this means, additional gray scale levels can be provided.

According to another preferred embodiment, each of the individually controllable elements may be configured such that the proportion of the radiation incident on it that is directed to the associated focusing element in each of its states is different to that of each of the other individually controllable elements associated with that focusing element.

This enables yet further gray scale levels to be provided. For example, consider an arrangement with three individually controllable elements associated with one focusing element. If the elements all direct the same proportion of the incident radiation to the focusing element in their maximum intensity state, then the intensity in the area on the substrate illuminated by the focusing element would be the same if any one of the individually controllable elements was set to the maximum state and the others set to a state in which zero radiation was directed to the focusing element. By arranging the maximum states for each of the elements to be different from one another, these three settings provide three different radiation intensities on the area on the substrate illuminated by the focusing element and hence different radiation doses or gray tones for a given exposure time.

A similar effect can be provided by having the same states for each of the individually controllable elements (i.e., in each of the corresponding states, all of the individually controllable elements direct the same proportion of the incident radiation onto the focusing element). At the same time, however, the radiation incident on each individually controllable element is attenuated such that the radiation incident on each associated element with a given focusing element is different. Alternatively, the radiation propagating from each of the individually controllable elements is attenuated such that a different proportion of the radiation directed from each of the individually controllable elements associated with a given focusing element reaches the focusing element. Some combination of the above methods may also be used.

Preferably, the apparatus is configured so that, in total, each point on the substrate associated with a single focusing element can be set to anyone of 256, 512 or 1024 gray scale levels of radiation intensity.

The apparatus may further include an actuator for moving the substrate relative to the projection system at a substantially constant velocity while a predetermined portion of the substrate is exposed. As the substrate scans beneath the projection system, the settings for the individually controllable elements are changed to provide the required pattern. In a preferred arrangement, the apparatus may further comprise a controller, for providing the settings to the individually controllable elements, which is arranged to be able to change the settings of the individually controllable elements while a point on the substrate is within the area illuminated by one of the focusing elements. Therefore, during the time that one point on the substrate is exposed by each focusing element, two different settings can be applied to the individually controllable elements. This provides additional control of the exposure dose received by such a point on the substrate.

For example, if the settings are changed halfway through the exposure time of that point then the radiation dose received by that point will be the average of the radiation dose that would have been received had the first setting been maintained for the full exposure time and the radiation dose that would have been received, had the second setting been maintained for the full exposure time. Therefore, if one individually controllable element is changed from full intensity to no intensity then the effect is to provide an exposure dose equivalent to that individually controllable element having been at half intensity for the full exposure. Thus, the effect of having an individually controllable element with an intermediate setting can be re-created even if it is not possible to provide such a setting to the individually controllable elements. Similarly, if the individually controllable elements can be set to intermediate states the effect of additional intermediate states can be created. Accordingly, additional gray tones are provided.

In a similar fashion, increased control of the radiation dose can be provided where each point on the substrate passes through two areas illuminated by different focusing elements. In this case, the controller can provide different settings to the individually controllable elements for each of the two sub-exposures (i.e., the exposures received from each focusing element) for that point and the total dose will be the sum of the two sub-exposures. Therefore, analogous to the situation described above, the total radiation dose will be equivalent to the average of the radiation dose that would have been received from exposure at the first setting for two sub exposure times (i.e., the time for the point to pass through the two illuminated areas) and the radiation dose that would have been received from exposure at the second setting for two sub exposure times. It will be appreciated that this technique can be combined with any of the preceding methods for controlling the total exposure dose, for example, those used to control the gray scale radiation intensity of the exposure.

According to yet another aspect of the present invention, there is provided a device manufacturing method comprising the steps of providing a substrate and using an array of individually controllable elements to impart the projection beam with a pattern in its cross-section. Also included are the steps of using an array of focusing elements as part of a projection system to project the patterned beam onto a target portion of the substrate. Each of the focusing elements is arranged to direct radiation in the patterned beam from a plurality of the individually controllable elements onto an area within the target portion. The individually controllable elements can be set to a plurality of different states, in each of which a different intensity of radiation propagates from the individually controllable element to the associated focusing element. The method further includes setting each of the individually controllable elements to the required states to produce a required intensity of radiation at said areas on the substrate.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further embodiments, features, and advantages of the present invention, as well as the structure and operation of the various embodiments of the present invention are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
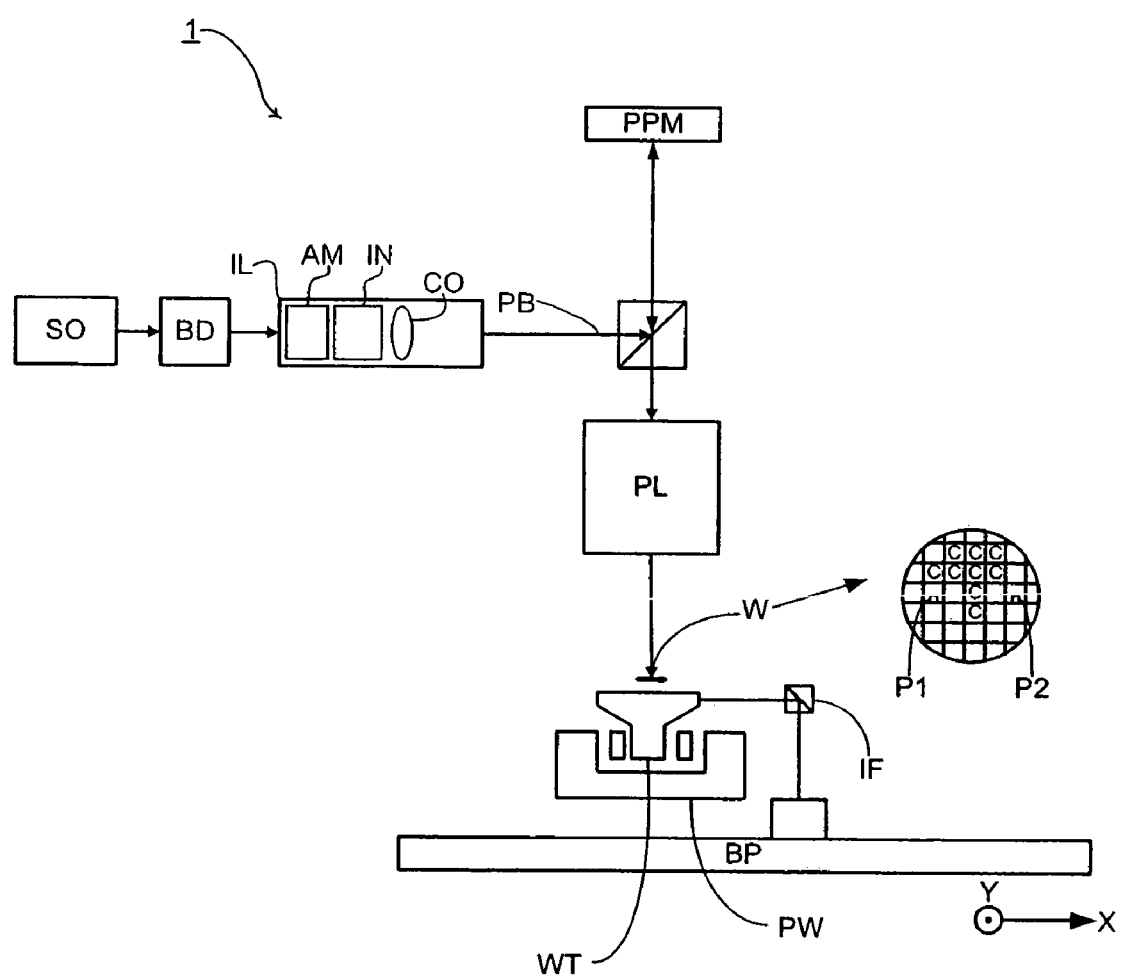
FIG. 1 depicts a lithographic projection apparatus according to an embodiment of the invention.

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

It would be apparent to one of skill in the art that the present invention, as described below, may be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, given the level of detail presented herein.

By way of background, the term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning means are provided below.

A programmable mirror array may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate. In this manner, the beam becomes patterned according to the addressing pattern of the matrix-addressable surface. It will be appreciated that, as an alternative, the filter may filter out the diffracted light, leaving the undiffracted light to reach the substrate.

An array of diffractive optical micro-electro-mechanical (MEMS) devices can also be used in a corresponding manner. Each diffractive optical MEMS device is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The required matrix addressing can be performed using suitable electronic means. In both of the situations described hereabove, the array of individually controllable elements can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference.

A programmable LCD array. An example of such a construction is given in United States patent U.S. Pat. No. 5,229, 872, which is incorporated herein by reference.

It should be appreciated that where pre-biasing of features, optical proximity correction features, phase variation techniques and multiple exposure techniques are used. For example, the pattern "displayed" on the array of individually controllable elements may differ substantially from the pattern eventually transferred to a layer of or on the substrate. Similarly, the pattern eventually generated on the substrate may not correspond to the pattern formed at anyone instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UY) radiation (e.g., having a wavelength of 365, 248, 193, 157 or 126 nm) and extreme ultra-violet (EUY) radiation (e.g., having a wavelength in the range of 20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

FIG. 1 schematically depicts a lithographic projection apparatus according to a particular embodiment of the invention. The apparatus includes an illumination system (illuminator) IL for providing a projection beam PB of radiation (e.g., UV radiation) and an array of individually controllable elements PPM (e.g., a programmable mirror array) for applying a pattern to the projection beam. In general, the position of the array of individually controllable elements will be fixed relative to item PL. However, it may instead be connected to a positioning means for accurately positioning it with respect to the item PL.

Also included is a substrate table (e.g., a wafer table) WT for supporting a substrate (e.g., a resist-coated wafer) W, and connected to positioning means PW for accurately positioning the substrate with respect to item PL. A projection system ("lens") PL is provided for imaging a pattern imparted to the projection beam PB by the array of individually controllable elements PPM onto a target portion C (e.g., comprising one or more dies) of the substrate W. The projection system may image the array of individually controllable elements onto the substrate. Alternatively, the projection system may image secondary sources for which the elements of the array of individually controllable elements act as shutters. The projection system may also comprise a micro lens array (known as an MLA), e.g., to form the secondary sources and to image microspots onto the substrate.

As depicted herein, the apparatus is of a reflective type (i.e., has a reflective array of individually controllable elements). However, in general, it may also be of a transmissive type, for example (i.e., with a transmissive array of individually controllable elements).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as a-outer and a-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning means PW (and interferometric measuring means IF), the substrate table WT can be moved accurately, e.g., so as to position different target portions C in the path of the beam PE. Where used, the positioning means for the array of individually controllable elements can be used to accurately correct the position of the array of individually controllable elements PPM with respect to the path of the beam PB, e.g., during a scan.

In general, movement of the object table WT is realized with the aid of a long-stroke module (course positioning) and a short-stroke module (fine positioning), which are not explicitly depicted in FIG. 1. A similar system may also be used to position the array of individually controllable elements. It will be appreciated that the projection beam may alternatively/additionally be moveable while the object table and/or the array of individually controllable elements may have a fixed position to provide the required relative movement.

As a further alternative, that may be especially applicable in the manufacture of flat panel displays, the position of the substrate table and the projection system may be fixed and the substrate may be arranged to be moved relative to the substrate table. For example, the substrate table may be provided with a system for scanning the substrate across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes. In a step mode, the array of individually controllable elements imparts an entire pattern to the projection beam, which is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

In scan mode, the array of individually controllable elements is movable in a given direction (the so-called "scan direction", e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

In a pulse mode, the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

A continuous scan mode is provided and is essentially the same as pulse mode. The exception is that in continuous scan mode, a substantially constant radiation source is used and the pattern on the array of individually controllable elements is updated as the projection beam scans across the substrate and exposes it. Combinations and/or variations on the above described modes of use or entirely different modes of use may also be employed.

Figure 2:
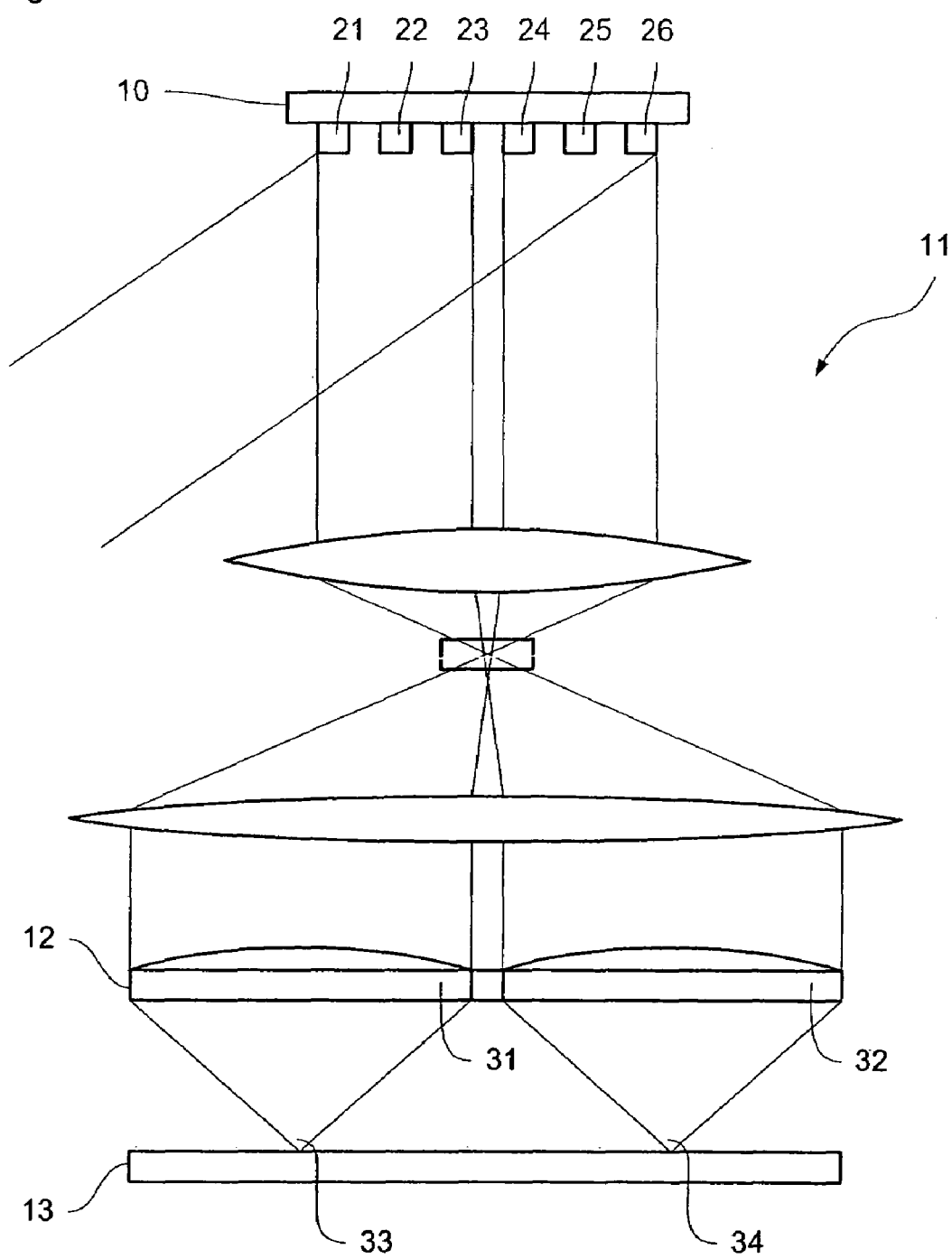
FIG. 2 depicts a schematic representation of a portion of the apparatus according to the present invention.

FIG. 2 represents a portion of an apparatus according to the present invention. In particular, it shows an array of individually controllable elements 10, a system of projection elements 11 and an array of focusing elements 12 for directing radiation onto a substrate 13. It will be appreciated that an alternative arrangement for projecting the radiation from the array of individually controllable elements 10 onto the array of focusing elements 12 may also be used. It will also be appreciated that the array of individually controllable elements may be illuminated by means of a beam splitter (arranged within the set of projection elements such that it diverts the projection beam of radiation onto a reflective array of individually controllable elements telecentrically, the reflection of which then passes straight through the beam splitter into the remainder of the projection system as is well known), may be illuminated by oblique radiation (as shown in FIG. 2) or could also be directly illuminated if it is of a transmissive configuration.

As shown, the array of individually controllable elements 10 comprises individually controllable elements 21 to 26. The array of focusing elements 12 comprises two focusing elements 31, 32. The radiation from three of the individually controllable elements 21, 22, 23 is directed to one of the focusing elements 32 and radiation from the remaining individually controllable elements 24, 25, 26 is directed to the other focusing element 31. It will be appreciated that, in practice, the array of focusing elements will have many more focusing elements. For example, the array of focusing elements may have 1025 by 968 focusing elements in the array. Furthermore, it will be appreciated that the array of individually controllable elements will likewise be significantly larger. Furthermore, as explained below, any number of individually controllable elements may be associated with each of the focusing elements.

Each of the focusing elements 31, 32 focuses the radiation directed onto it to an associated area 33, 34 on substrate 13. The intensity of the radiation in each area is dependant on the sum of the intensities of the portions of the patterned beam from each of the individually controllable elements associated with that focusing element. Therefore the radiation at the area 34 on the substrate 13 associated with the focusing element 32 is dependant on the intensity of the radiation propagating from each of individually controllable elements 21, 22, 23. Each of the individually controllable elements 21 to 26 can be set to a plurality of states. In a simple situation the elements may be set to either direct radiation onto the associated focusing element 20 or not. Therefore, it has two states, namely full intensity and zero intensity.

In the example shown in FIG. 2, being able to set each of the three individually controllable elements associated with each focusing element, results in being able to provide four different levels of radiation intensity at the area on the substrate to which the radiation from one focusing element is directed. Specifically, all of the elements may be set to zero radiation, resulting in zero radiation at the area on the substrate illuminated by the focusing element. All the elements may be set to full intensity, providing maximum intensity at the area on the substrate illuminated by the focusing element. Only one of the individually controllable elements may be set to full intensity, providing an intensity level at the area on the substrate illuminated by the focusing element that is one-third of the maximum intensity. Or two of the individually controllable elements may be set to full intensity, providing two-thirds of the maximum intensity at the area on the substrate illuminated by the focusing element.

It will be appreciated that with different numbers of individually controllable elements associated with each focusing element, different numbers of intensity levels or gray scales at the area on the substrate may be provided. With one individually controllable element per focusing element, for example, two intensity levels are provided. With two elements, three levels are provided. As discussed above with three individually controllable elements, four levels are provided, and so on. In the schematic representation shown in FIG. 2, the three individually controllable elements associated with each focusing element are, for clarity, shown arranged in a row. It should be appreciated, however, that in practice the individually controllable elements may be arranged in different configurations. For example, if four individually controllable elements are used per focusing element these may be arranged in a square configuration.

The preceding description has been in relation to the use of individually controllable elements that can either pass radiation to the focusing elements or not. It will, be appreciated that in practice some radiation may be directed to the focusing element even in the low intensity state of the individually controllable element. In other words, the two states of the individually controllable element will be a relatively higher intensity state and a relatively lower intensity state.

The invention may also be used with individually controllable elements that can be set to additional states. For example, the elements may be set to one or more intermediate states in which radiation at an intensity between the high intensity level and the low intensity level is directed to the focusing element. For example, each of the individually controllable elements may be able to provide radiation at an intensity level halfway between the higher intensity level and the lower intensity level.

In this case, the arrangement as shown in FIG. 2 would be able to provide three additional levels of radiation intensity at the area on the substrate illuminated by the focusing element, namely one between the minimum intensity level and the one-third intensity level (as referred to above), one between the one-third level and the two-third intensity level and one between the two-third intensity level and the maximum intensity level.

It will be appreciated that this benefit also applies to the use of any number of individually controllable elements associated with each focusing element. Furthermore, it will be apparent that providing additional control states for each individually controllable element further increases the number of intensity levels capable of being generated at the area that is illuminated on the substrate. In practice, each individually controllable element may, for example, be capable of generating up to 256 different intensity levels.

In a system as described above, there is some redundancy. For example, the radiation intensity at the area illuminated on the substrate will be the same if a first of the individually controllable elements is set to a first state and the remaining two are set to a second state as compared with a second of the individually controllable elements being set to the first state and the remaining two being set to the second state.

Therefore, each of the individually controllable elements associated with one focusing element may be configured such that in each of their states they direct a different proportion of the intensity of the radiation that is incident on them to the associated focusing element. In this case, the intensity of the radiation received at the area on the substrate that is illuminated will be different if, for example, a first of the individually controllable elements is set to its maximum intensity and the remaining individually controllable elements are set to minimum intensity then when a second of the individually controllable elements is set to its maximum intensity and the other elements are set to minimum intensity. Therefore, if as in this example, three individually controllable elements are used per focusing element and each is capable of being set into three different states, nine different intensity levels may be generated in the area of the substrate that is illuminated.

As described above, the individually controllable elements associated with each focusing element may be configured to transmit a different proportion of the radiation incident on them to the focusing element in each of their corresponding states. Alternatively, however, the apparatus may be configured such that the radiation that is incident on each of the individually controllable elements associated with one focusing element has a different intensity level. This may be achieved, for example, by providing an array of attenuators associated with the array of individually controllable elements.

The incident radiation directed to a first one of the individually controllable elements may, for example, not be attenuated at all while the radiation directed to each of the other individually controllable elements associated with the same focusing element are attenuated by differing amounts. Therefore, even though each of the individually controllable elements directs the same proportion of the radiation incident upon it to the focusing element in each of the corresponding states, the radiation received at the focusing element from each of the individually controllable elements will be different.

Therefore, as before, additional intensity levels at the area of the substrate being illuminated by the focusing element are created. Instead of attenuating the radiation that is incident on the individually controllable elements, it will be appreciated that alternatively or additionally, the radiation from each of the individually controllable elements may be attenuated between individually controllable elements and the associated focusing elements.

The above described arrangements provide ways of controlling the intensity of the radiation in the area on the substrate that is illuminated by each of the focusing elements. Therefore, the radiation dose received by the areas can be varied when each of the areas on the substrate is illuminated for a given exposure time.

Further control of the radiation dose may be provided by arranging for each area on the substrate to receive two exposures, one at each of two intensities. If, for example, each of the two exposures is for an equal amount of time, the dose received by the area will be the average of the dose that would have been received had the intensity level of the first exposure been maintained for the complete exposure time and the dose that would have been received had the intensity level of the second exposure been maintained for the entire time. Therefore it is possible provide further intermediate radiation doses. It will be appreciated that by providing further exposures (i.e., more than two), further intermediate dose levels can be provided.

In practice, the substrate may be moved by an actuator relative to the projection system at a constant velocity. In this case, the additional dose control as discussed above may be provided for a point on the substrate by changing the settings applied to the individually controllable elements while the point is passing through the area illuminated by the associated focusing element. For example, it may be changed half way through the point's passage across the illuminated area.

Alternatively or additionally each point on the substrate may, as the substrate scans beneath the projection system, pass through the area illuminated by two or more different focusing elements. In this case the controller for setting the individually controllable elements may be arranged to provide the two different radiation intensity levels in the different areas illuminated by the different focusing elements as the point passes through each of the illuminated areas.

Consequently, the point will be illuminated by each focusing element for a given amount of time at the requisite intensity level, producing the overall radiation dose level required. In practice, for example, a single point on the substrate may pass through several tens of different areas illuminated by different focusing elements. Therefore, each point potentially receives several tens of independent exposures, permitting a great number of gray tone levels to be generated.

It will be appreciated that any combination of the techniques discussed above for controlling the radiation dose or gray tone level may be used together. For example, a plurality of intensity levels or gray scales may be provided for each of a plurality of sub-exposures of each point on the substrate.

Figure 3:
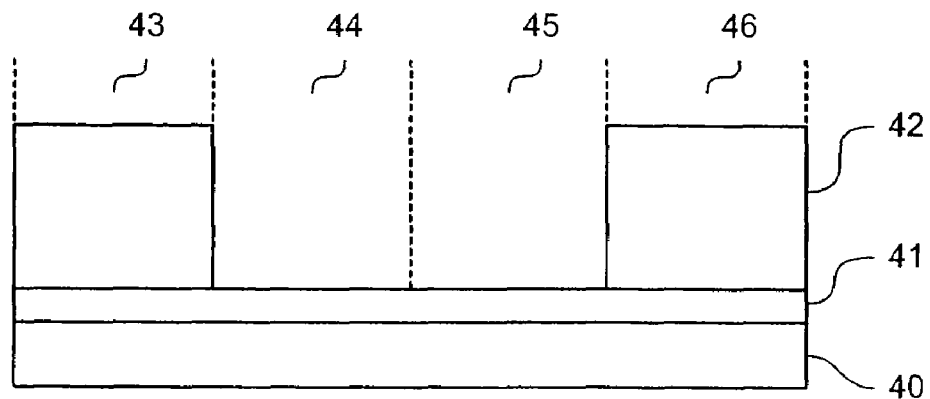
FIG. 3 depicts a substrate after an exposure.
Figure 4A:
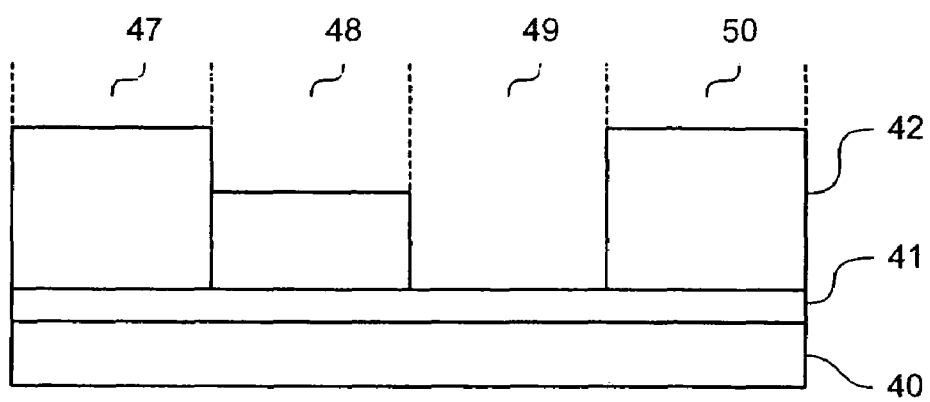
FIG. 4a depicts a substrate after a different exposure regime than that of FIG. 3.
Figure 4B:
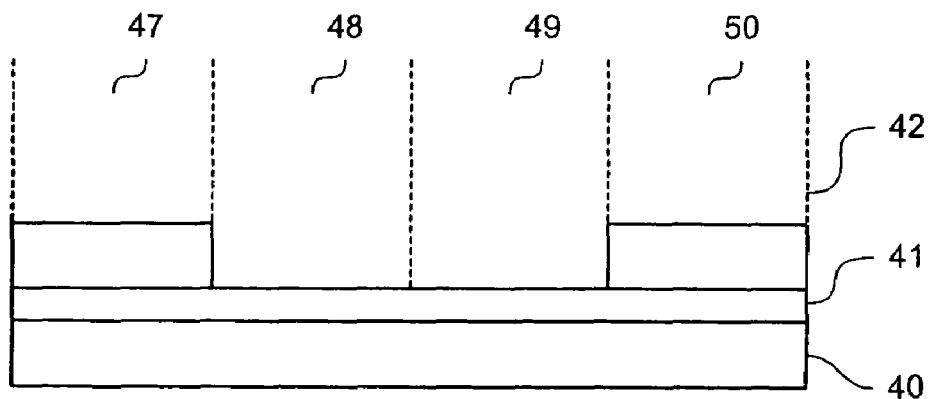
FIG. 4b depicts the substrate of FIG. 4a after subsequent processing steps.

FIGS. 3, 4a, and 4b illustrate the advantage of gray tone exposure control. FIG. 3 shows a substrate 40 after exposure without gray tone. In areas 44, 45, a resist 42 has been completely removed, exposing the corresponding portions of a device layer 41 which are then subject of the subsequent processing operations. In areas 43, 46, the full layer of resist remains in place so the corresponding portions of the device layer underneath the resist are not affected by the subsequent processing operations.

FIG. 4a shows the substrate 40 after an exposure using gray tone. In addition to areas 47, 50 where none of the resist has been removed and area 49 where all of the resist have been removed, there is an area 48 where the resist has been partially removed by a gray tone exposure (i.e., the area has received a dose of radiation between the minimum and maximum dose). Accordingly in the processing steps that immediately follow, only area 49 of the device layer 41 is exposed and affected by the processing steps.

However, subsequently, as shown in FIG. 4b, given thickness of resist 42 is removed. This exposes the device layer 41 in area 48, which had received the partial exposure (as well as the area 49 which is already exposed), but does not expose the device layer in areas 47, 50 which received the minimum exposure. In the process steps that follow, therefore, areas 48, 49 are affected but areas 47, 50 are not.

Accordingly the first set of process steps can be applied to a first set of areas and the second set of process steps can be applied to a second set of areas after only a single radiation exposure step. Thus the provision of gray tone control can be used to reduce the requirement for radiation exposure steps. It will be appreciated that by using larger numbers of gray tone levels and repeatedly removing a given uniform level of resist from the device between series of processing steps, further reduction in the number of radiation exposure steps can be achieved.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application specific integrated circuits, firmware, processors executing appropriate software and the like or any combination thereof. Thus, the breadth and scope of the present invention should not be limited by any of the above-described exemplary embodiments, but should be defined only in accordance with the following claims and their equivalents.

What we claim is:

1. An apparatus comprising:
   (i) an array of individually controllable elements to receive and pattern a projection beam of radiation; and
   (ii) an array of focusing elements comprising at least two focus elements, each being optically associated with a separate group of the individually controllable elements;
   wherein each of the individually controllable elements can be set to at least two states in which a corresponding portion of the patterned projection beam provides radiation at an intensity between the least two states.

2. The apparatus of claim 1, wherein the array of focusing elements comprises more than two focus elements.

3. The apparatus of claim 1, wherein the plurality of said individually controllable elements is arranged in a square configuration.

4. The apparatus of claim 1, wherein the array of individually controllable elements is a programmable mirror array.

5. The apparatus of claim 1, wherein the apparatus is a lithography apparatus.

6. A method, comprising:
   (i) receiving and patterning a projection beam of radiation with an array of individually controllable elements;
   (ii) focusing the patterned projection beam with an array of focusing elements comprising at least two focus elements, each being optically associated with a separate group of the individually controllable elements, and wherein each of the individually controllable elements within each group can be set to at least two states in which a corresponding portion of the patterned projection beam provides radiation at an intensity between the at least two states; and
   (iii) exposing a substrate to radiation by each of the separate groups of individually controllable elements.

* * * * *